United States Patent
Benner

(10) Patent No.: US 8,598,526 B2
(45) Date of Patent: Dec. 3, 2013

(54) TRANSMISSION ELECTRON MICROSCOPE

(75) Inventor: Gerd Benner, Aalen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 478 days.

(21) Appl. No.: 13/036,757

(22) Filed: Feb. 28, 2011

(65) Prior Publication Data

US 2011/0210249 A1     Sep. 1, 2011

(30) Foreign Application Priority Data

Mar. 1, 2010   (DE) .................. 10 2010 009 707

(51) Int. Cl.
*H01J 37/26*     (2006.01)

(52) U.S. Cl.
USPC ............ 250/311; 250/306; 250/307; 250/310

(58) Field of Classification Search
USPC .................................. 250/306, 307, 310, 311
See application file for complete search history.

(56) References Cited

U.S. PATENT DOCUMENTS

| | | | |
|---|---|---|---|
| 3,624,393 A | 11/1971 | Torquebiau | |
| 4,740,704 A | 4/1988 | Rose et al. | |
| 4,812,652 A | 3/1989 | Egle et al. | |
| 6,040,576 A | 3/2000 | Benner | |
| 7,285,776 B2 | 10/2007 | Nakamura et al. | |
| 2001/0042830 A1 | 11/2001 | Kaneyama et al. | |
| 2002/0033455 A1 | 3/2002 | Rose | |
| 2005/0242284 A1* | 11/2005 | Kaneyama ..................... | 250/310 |
| 2005/0274889 A1 | 12/2005 | Shindo et al. | |
| 2008/0035854 A1 | 2/2008 | Jin et al. | |
| 2009/0166558 A1 | 7/2009 | Nagayama | |
| 2010/0181481 A1 | 7/2010 | Benner et al. | |
| 2012/0025094 A1 | 2/2012 | Benner et al. | |

FOREIGN PATENT DOCUMENTS

| | | |
|---|---|---|
| DE | 2 028 357 | 2/1971 |
| DE | 60 2005 004 328 T2 | 11/2005 |
| DE | 10 2006 011 615 A1 | 9/2007 |
| EP | 0 218 920 A2 | 4/1987 |
| EP | 0 166 328 B1 | 1/1991 |
| EP | 0 899 771 A2 | 3/1999 |
| EP | 2 413 345 A1 | 2/2012 |

OTHER PUBLICATIONS

G. Benner et al., "State of the First Aberration-Corrected, Monochromized 200kV FEG-TEM", Microscopy and Microanalysis, Springer, vol. 9, Suppl. 3, 2003, pp. 38-39.

(Continued)

*Primary Examiner* — Michael Maskell
(74) *Attorney, Agent, or Firm* — Bruce D Riter

(57) ABSTRACT

A transmission electron microscope in which a sample is positioned in a sample plane 9$b$ comprises an objective lens 11$b$, a first projection lens system 61$b$ having plural lenses, a second projection lens 63$b$ system having plural lenses, and an analyzing system.
The sample plane 9$b$ is imaged into an intermediate image plane 71, a diffraction plane 15$b$ of the objective lens 11$b$ is imaged into an intermediate diffraction plane 67$b$, and either
  a) the intermediate image plane is imaged into an entrance image plane of the analyzing system and the intermediate diffraction plane is imaged into an entrance pupil plane of the analyzing system, or
  b) the intermediate image plane 71 is imaged into the entrance pupil plane 65$b$ and the intermediate diffraction plane 67$b$ is imaged into the entrance image plane 21$b$.

19 Claims, 11 Drawing Sheets

(56) References Cited

OTHER PUBLICATIONS

Search Report in parallel Dutch patent application No. 2006308 of Jan. 3, 2013, 9 pp.

H. Lichte, "Electron Holography: Optimum Position of the Biprism in the Electron Microscope", Ultramicroscopy 64, 1996, pp. 79-86.

L. Reimer, "Energy Filtering Transmission Electron Microscopy", Kapitel III, Instrumentation and Modes, Advances in Electronics and Electron Physics, Band 81, Academic Press, New York, 1991, pp. 62-75.

Office action in German patent application No. 10 2010 009 707.1 of Oct. 27, 2010.

* cited by examiner

TRANSMISSION ELECTRON MICROSCOPE

CROSS-REFERENCE TO RELATED APPLICATIONS

The present application claims priority of Patent Application No. 10 2010 009 707.1, filed Mar. 1, 2010 in Germany, entitled "TRANSMISSION ELECTRON MICROSCOPE", the content of which is hereby incorporated by reference in its entirety.

FIELD

The present disclosure relates to transmission electron microscopes.

BACKGROUND

In a transmission electron microscope, an electron beam is directed to a sample, and electrons having traversed the sample are detected in an analyzing system located downstream of the sample in the beam path of the transmission electron microscope. Information relating to properties of the sample are derived from the detected electrons. The electrons incident on the sample interact with the sample. Such interaction includes, for example, scattering of the electrons, deflection by a certain angle and change of a kinetic energy of the scattered electrons.

One possible type of analysis of the electrons having traversed the sample includes separating electrons having traversed the sample substantially unscattered from electrons having experienced a deflection by a significant angle due to their interaction with the sample. The scattered and the unscattered electrons can be separately detected, and, for example, an image which is generally referred to as a bright field image, can be generated from those electrons having traversed the sample substantially unscattered. Moreover, an image generally referred to as a dark field image can be generated from the electrons scattered by a significant angle.

A further type of analysis of electrons having traversed the sample includes analyzing a kinetic energy of the electrons. The electrons incident on the sample may excite processes within the sample resulting in an energy loss of the electrons. For example, information relating to a chemical composition of the sample can be obtained from an analysis of such energy loss. The analysis of the kinetic energy of the electrons may involve an energy filter having an entrance image plane and an entrance pupil plane.

Some further type of analysis of electrons having traversed the sample may include subjecting different portions of the beam of electrons having traversed the sample to different phase shifts, and to subsequently superimpose the beam portions with each other and to detect a resulting interference pattern. Such type of analysis is commonly known as phase contrast microscopy.

A still further type of analysis of the electrons having traversed the sample may involve separating the beam into two beam portions using a bi-prism, superimposing the separated beam portions with each other and generating an interference pattern. Phase information relating to the sample can be obtained by analyzing the interference pattern. Such type of analysis is commonly referred to as electron beam holography.

The different types of analysis of electrons having traversed the sample require different configurations of an analyzing system. It is generally difficult to perform plural different types of analysis using a same or similar configuration of the transmission electron microscope.

SUMMARY

The present invention has been accomplished by taking the above considerations into account.

It is an object of the present invention to provide a transmission electro microscope comprising an analyzing system having an entrance image plane and an entrance pupil plane and which is sufficiently flexible to allow one or more types of analysis of electrons having traversed a sample.

According to some embodiments, a transmission electro microscope comprises an analyzing system having, on its upstream side within the beam path of the microscope, an entrance image plane and an entrance pupil plane. According to exemplary embodiments herein, the analyzing system includes an energy filter having, on its upstream side, an entrance image plane and an entrance pupil plane and having, on its downstream side, an output image plane which can be also be referred to as an achromatic image plane, and an output pupil plane, which can also be referred to as a spectrum plane. Trajectories of electrons having different energies and originating from a same location within the entrance image plane are focused at same locations within the output image plane. On the other hand, trajectories of electrons having same kinetic energies and originating from different locations in the entrance pupil plane are focused on a same location, such as a point shaped location or a line shaped location, within the output pupil plane, while trajectories of electrons having different energies are focused at different locations within the outward pupil plane.

According to other embodiments, a transmission electron microscope comprises an objective lens system positioned downstream of the sample in the beam path of the microscope, a first projection lens system having at least two lenses positioned downstream of the objective lens in the beam path, and a second projection lens system having at least two lenses positioned downstream of the first projection lens system.

According to an embodiment herein, the objective lens system images the sample plane into an intermediate image plane, the first projection lens system images a diffraction plane of the objective lens system which is also referred to as a back focal plane of the objective lens, into an intermediate diffraction plane, and the second projection lens system images the intermediate image plane into an entrance image plane of the analyzing system and the intermediate diffraction plane into an entrance pupil plane of the analyzing system.

According to a further exemplary embodiment, the objective lens images the sample plane into an intermediate image plane, the first projection lens system images the diffraction plane of the objective lens into an intermediate diffraction plane, and the second projection lens system images the intermediate image plane into the entrance pupil plane of the analyzing system and the intermediate diffraction plane into the entrance image plane of the analyzing system.

According to exemplary embodiments herein, the analyzing system comprises an energy filter.

Within the context of the present disclosure the term "one plane is imaged into another plane" comprises both a single stage configuration in which no additional image planes are present between the two planes, and multi-stage configurations in which one or more intermediate image planes are present between the two planes. Specifically, one or more intermediate image planes can be provided between the sample plane and the intermediate image plane. Similarly, additional intermediate diffraction planes can be provided between the diffraction plane and the intermediate diffraction plane. Moreover, positions of the intermediate image plane and/or of the intermediate diffraction plane may change along the beam path of the microscope if an energization of one or more lenses of the objective lens system or the first or second projection lens systems changes. Still further, additional intermediate image planes can be provided between the intermediate image plane and the entrance image plane or entrance pupil plane of the analyzing system. Similarly, additional intermediate diffraction planes can be provided between the intermediate diffraction plane and the entrance pupil plane or entrance image plane of the analyzing system.

The illustrated multi-stage imaging of the sample plane and of the diffraction plane of the objective lens allows to arrange additional components between the objective lens system and the analyzing system in order to perform the additional type of analysis of electrons having traversed the sample. Moreover, such multi-stage imaging using the first and second projection lens systems introduces additional degrees of freedom allowing optimizing of both the analysis using the analyzing system, such as an energy analysis, and the additional type of analysis.

According to exemplary embodiments, a magnification of the imaging of the diffraction plane of the objective lens system into the intermediate diffraction plane is greater than 1. According to particular embodiments herein, the magnification is within a range from 4 to 80, and according to further particular embodiments, the magnification is within a range from 8 to 40.

According to some embodiments, the first projection lens system comprises at least two lenses which are positioned downstream of the objective lens system and upstream of the intermediate image plane. The at least two lenses of the first projection lens system can be energized by a control module such that the image magnification of the imaging of the diffraction plane of the objective lens system and the intermediate diffraction plane can be changed. In particular, the at least two lenses and the control module are configured such that the image magnification can be changed from 4 to 80, or from 8 to 40 or from 12 to 30. According to particular embodiments herein, the at least two lenses and the control module are configured such that a position of the intermediate diffraction plane along the beam path remains substantially unchanged when the image magnification is changed.

According to some embodiments, the second projection lens system is configured such that an image magnification of the imaging of the intermediate diffraction plane into the entrance image plane of the analyzing system is less than 3 and, in particular, the second projection lens system can be configured such that the image magnification of the imaging of the intermediate diffraction plane into the entrance image plane of the analyzing system is within a range from 0.05 to 3.0 or within a range from 0.1 to 1.5.

According to exemplary embodiments, the transmission electron microscope is configured such that a lens of the second projection lens system has a main plane which substantially coincides with the intermediate diffraction plane or such that it is located proximate to the intermediate diffraction plane. Within the present disclosure, the main plane of this lens is located proximate to the intermediate diffraction plane if a distance between the intermediate diffraction plane and the main plane of the lens is less than 5 mm or less than one half of a focal length of this lens.

According to embodiments, the transmission electron microscope comprises a dark field detector located at or proximate to the intermediate diffraction plane in order to detect electrons which have been deflected within the sample, by a significant angle, wherein electrons having traversed the sample without deflection or deflection by a non-significant angle, are not detected by the dark field detector.

According to further embodiments, a phase changing element is positioned in the intermediate diffraction plane or proximate to the intermediate diffraction plane. The phase changing element is configured such that two different portions of the electron beam traversing the phase changing element experience different phase changes. The two different portions may interfere with each other in a downstream image plane and can be detected to obtain a phase contrast image of the sample.

According to further embodiments, the transmission electron microscope comprises a bi-prism located in the beam path downstream of the diffraction plane and upstream of the analyzing system. The bi-prism separates a beam of electrons having traversed the sample into two coherent beam portions which are, again, superimposed with each other in the image plane such that an interference pattern or hologram is generated in the intermediate image plane.

Such interference pattern can be analyzed in order to determine phase changes which an electron wave experiences within the sample.

According to still further embodiments, the transmission electron microscope comprises an image corrector located in the beam path downstream of the objective lens and upstream of the first projection lens system.

BRIEF DESCRIPTION OF THE DRAWINGS

The forgoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

DETAILED DESCRIPTION OF EXEMPLARY EMBODIMENTS

Figure 1:
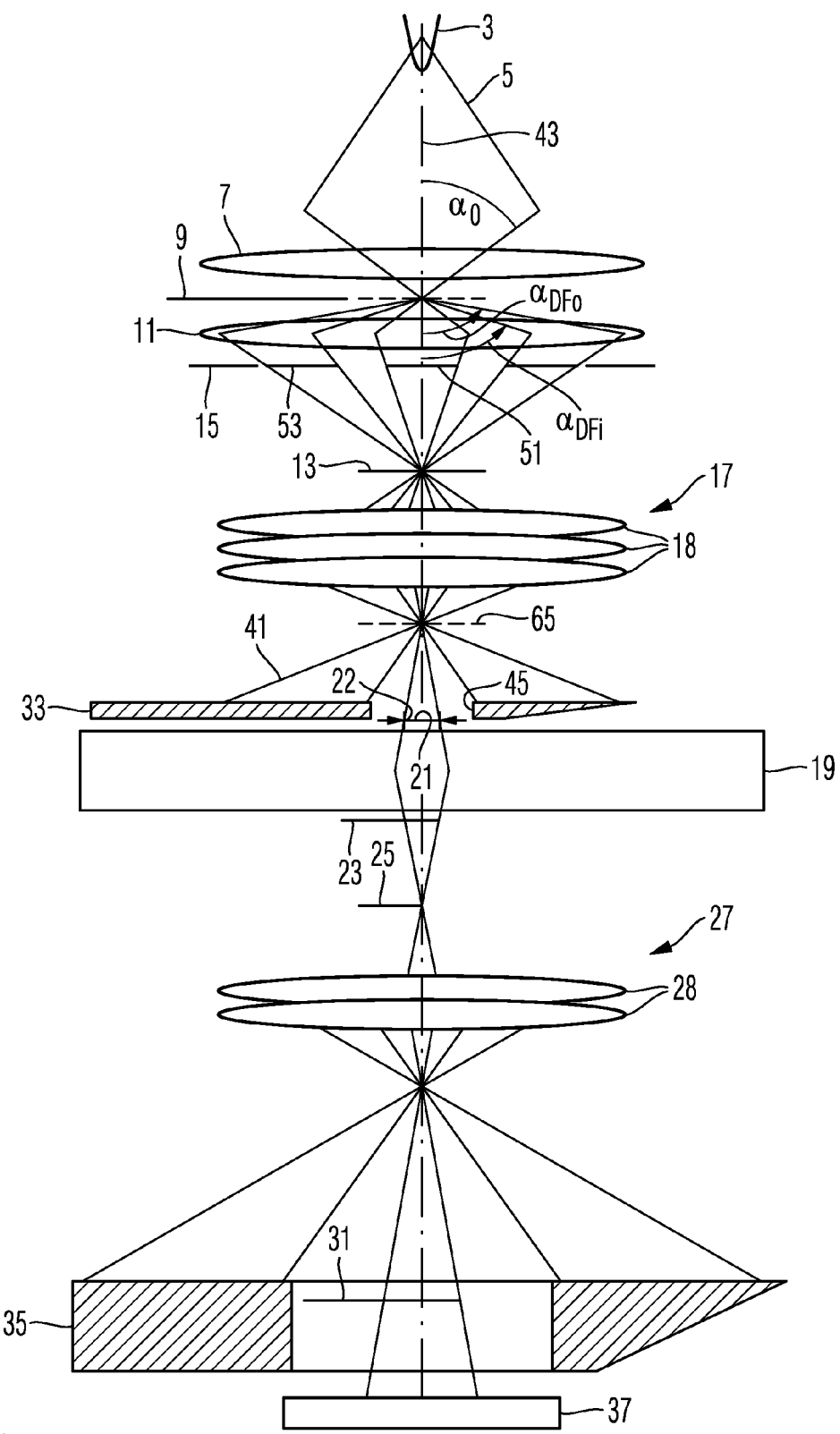
FIG. 1 is a schematic illustration of a transmission electron microscope.

In the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

FIG. 1 is a schematic illustration of a transmission electron microscope comprising an energy filter.

The transmission electron microscope 1 comprises an electron beam source 3 emitting an electron beam 5 which is focused in a sample plane 9 by an electron optical lens 7. Apart from the lens 7 shown in FIG. 1, additional lenses and electron optical elements, such as, for example, condenser lenses, correctors and beam deflectors can be arranged in the beam path between the source 3 and the sample plane 9. The additional lenses and correctors can be provided in order to generate a small beam focus in the sample plane, and the additional elements and beam deflectors can be provided in order to laterally displace the beam focus in the sample plane such that the transmission electron microscope can be operated as a scanning transmission electron microscope (STEM). Moreover, it is possible to illuminate, with the beam 5, an extended region within the sample plane 9, such that the microscope can be operated as an imaging transmission electron microscope (TEM).

An objective lens 11 is positioned downstream of the sample plane 9 in the beam path. The objective lens 11 images the sample plane 9 into an intermediate image plane 13, and the objective lens 11 has a diffraction plane 15.

A projecting lens system 17 and an analyzing system including an imaging energy filter are positioned downstream of the objective lens in the beam path. FIG. 1 shows, as an example, three lenses 18, providing the function of the projection lens system, since the projection lens system may generally comprise more than one lens. The energy filter 19 has, on its upstream side, an entrance image plane 21 and an entrance pupil plane 65, and it has, on its downstream side or output side, respectively, an achromatic image plane 23 and a spectrum plane 25 in which an energy loss spectrum of the electrons having traversed the sample is formed.

Further, the projection lens system 17 images the diffraction plane 15 of the objective lens 11 into the entrance image plane 21 of the energy filter 19. A spectrometer entrance aperture 22 can be positioned in the entrance image plane 21 of the energy filter.

A slit shaped aperture can be provided in the spectrum plane 25 of the energy filter 19 in order to select a narrow band of kinetic energies of electrons having traversed the energy filter and which are allowed to traverse the aperture. An imaging system 27 having one or more lenses 28 is positioned downstream of the spectrum plane 25 in order to image the achromatic image plane 23 into an image plane 31 such that an energy filtered image of the diffraction plane 15 of the objective lens 11 is formed in the image plane 31. As an alternative, the imaging system 27 may image the spectrum plane 25 onto a detector in order to detect an energy loss spectrum of an angular range of electrons selected by the spectrometer entrance aperture 22. The spectrometer entrance aperture 22 defines an acceptance angle of such detection, accordingly.

The exemplary transmission electron microscope 1 illustrated in FIG. 1 comprises three detectors 33, 35 and 37. The detector 33 is a first dark field detector positioned at or proximate to the entrance image plane 21 of the energy filter 19. The detector 35 is a second dark field detector positioned in the beam path downstream of the energy filter 19, and the detector 37 is a bright field detector positioned downstream of the energy filter 19.

The dark field detector 33 positioned upstream of the energy filter 19 has a ring shaped sensitive cross section.

For example, the dark field detector 33 can be formed of a plate of light conducting material carrying scintillation material on a side facing towards the sample plane 9, or it includes scintillating material in the bulk volume of the plate. The plate comprises a circular aperture having a center which coincides with an optical axis 43 of the beam path of the microscope 1. Bright field electrons and dark field electrons having experienced a small scattering angle when traversing the sample may traverse the aperture of the dark field detector 33.

The electron beam 5 is shaped upstream of the sample plane such that electrons are incident on the sample plane 9 from within an angular range. An envelope of trajectories of electrons incident on one point within the sample plane 9 has a conic shape, accordingly. A half opening angle of this conic shape is illustrated at $\alpha_0$ in FIG. 1. An envelope of trajectories of electrons having traversed the sample plane 9 substantially unscattered will have the same half opening $\alpha_0$. These electrons are referred to as bright field electrons. The bright field electrons traverse the back focal plane 15 of the objective lens 11 within a circular cross section 51 having a radius which fulfills the equation $r_{BF}=f_0\alpha_0$, wherein $f_0$ is the focal length of the objective lens 11 and $r_{BF}$ is the radius of the circular cross section 51.

FIG. 1 further shows a ring circular cross section 53 within focal plane 15, wherein cross section 53 is traversed by dark field electrons scattered in the sample plane 9 by a substantial angle. Those dark field electrons can be detected by a dark field detector positioned in a plane conjugate to the diffraction plane 15 and downstream of the diffraction plane. An inner envelope of trajectories of those dark field electrons has an angle relative to the optical axis 43 which is indicated at $\alpha_{DFi}$ in FIG. 1, and an outer envelope of the trajectories of those dark field electrons has an angle relative to the optical axis 43 indicated at $\alpha_{DFo}$ in FIG. 1. A ring shaped region between circular ring surface 53 and circular surface 51 within the diffraction plane 15 is traversed by dark field electrons scattered in the sample plane 9 by a small scattering angle. These electrons are not detected by one of the detectors 33, 35 and 37.

Exemplary values of the half opening angle $\alpha_0$ used in a non-corrected transmission electron microscope amount to 8 mrad, while exemplary values for the half opening angle $\alpha_0$ used in corrected transmission electron microscopes may amount up to 50 mrad. Exemplary values of the half opening angle $\alpha_{DF}$ amount from 50 mrad to 150 mrad. Due to limitations in manufacture, a minimum diameter of the aperture 45 in the dark field detector 33 will be more than 2 mm, for example. On the other hand, a diameter of the entrance image field in the plane 21 of the energy filter 19 defined by the spectrometer entrance aperture 22 should have a value of less than 300 μm, for example. In order to be able to detect dark field electrons having experienced a small scattering angle at a given minimum diameter of the aperture 45 in the dark field detector 33, it might be necessary to image the diffraction plane 15 into the plane 21 at an imaging magnification which is greater than 1. For this purpose, an imaging magnification of the projection lens system 17 for imaging the diffraction plane 15 into the plane 21 can be within a range from 1 to 20. However, such magnifying imaging also results in expanding the diameter of the bright field image 22 in the entrance image plane 21 of the energy filter 19 which would reduce the energy resolution of the energy filter 19.

Figure 2:
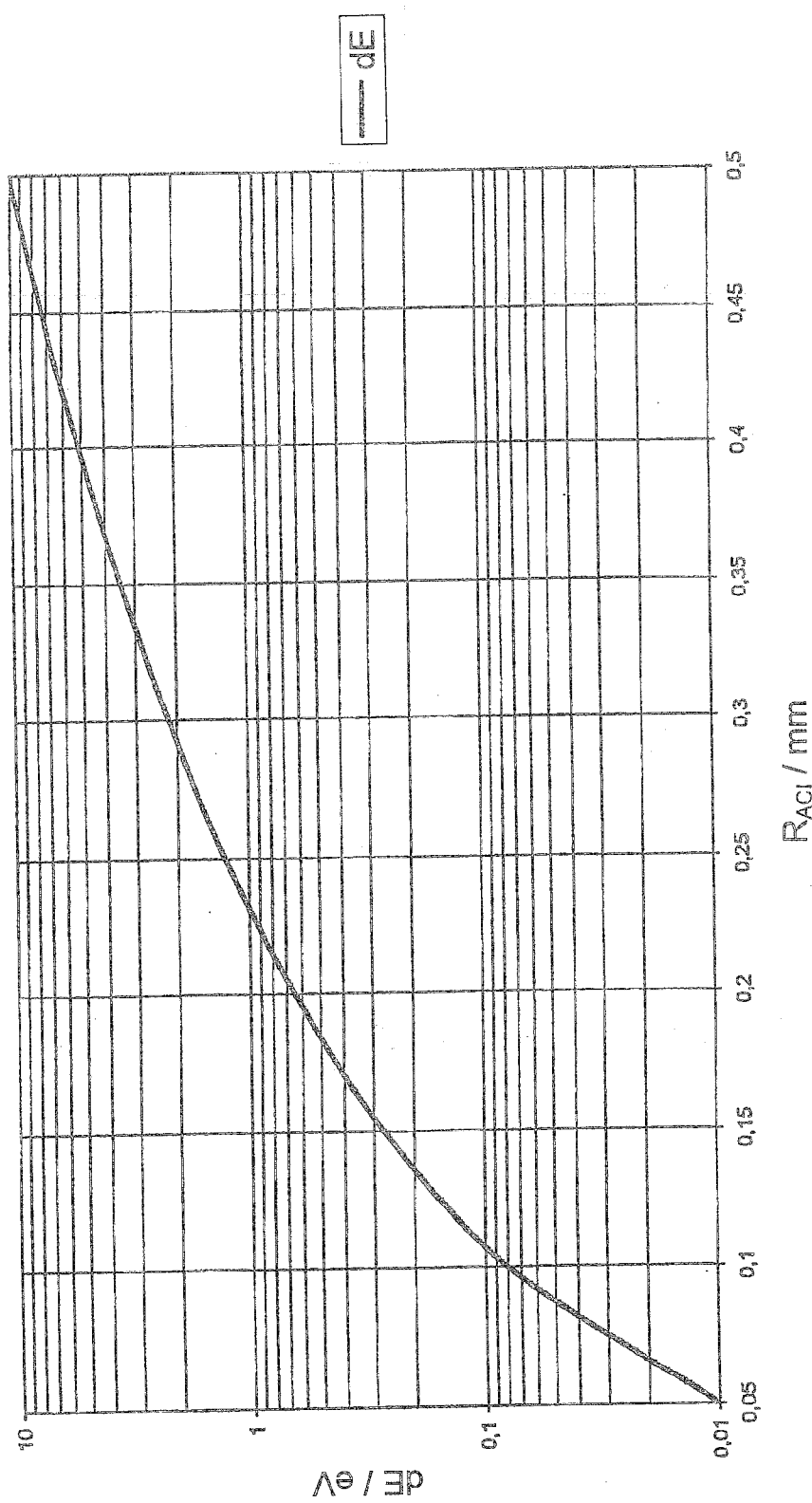
FIG. 2 is a graph illustrating a relation between properties of the electron microscope shown in FIG. 1.

FIG. 2 shows a relation between the radius R of the image field in the entrance image plane 21 of the energy filter 19 and the energy resolution dE of an exemplary energy filter which has a configuration of a second order corrected omega filter as illustrated, for example in chapter III Instrumentation and Modes of the Article Energy Filtering Transmission Electron Microscopy by L. Reimer, in Advances in Electronics and Electron Physics Volume 81, Academic Press, New York, 1991, pages 62 to 75.

According to the graph shown in FIG. 2, an entrance image field diameter 2R of 300 μm results in an energy resolution of about 0.3 eV. This can be satisfactory for a transmission electron microscope using a beam of electrons having kinetic energies varying by 0.8 eV. If, however, a transmission electron microscope is used which has a monochromator in order to reduce the kinetic energy width to 0.1 eV, this may not be sufficient since the energy resolution is limited by the energy filter rather than the incident electron beam.

From FIG. 2 it is apparent that the interest in detecting dark field electrons experiencing small scattering angles using the dark field detector 33 and the interest in a high energy resolution represent conflicting interests.

Figure 3:
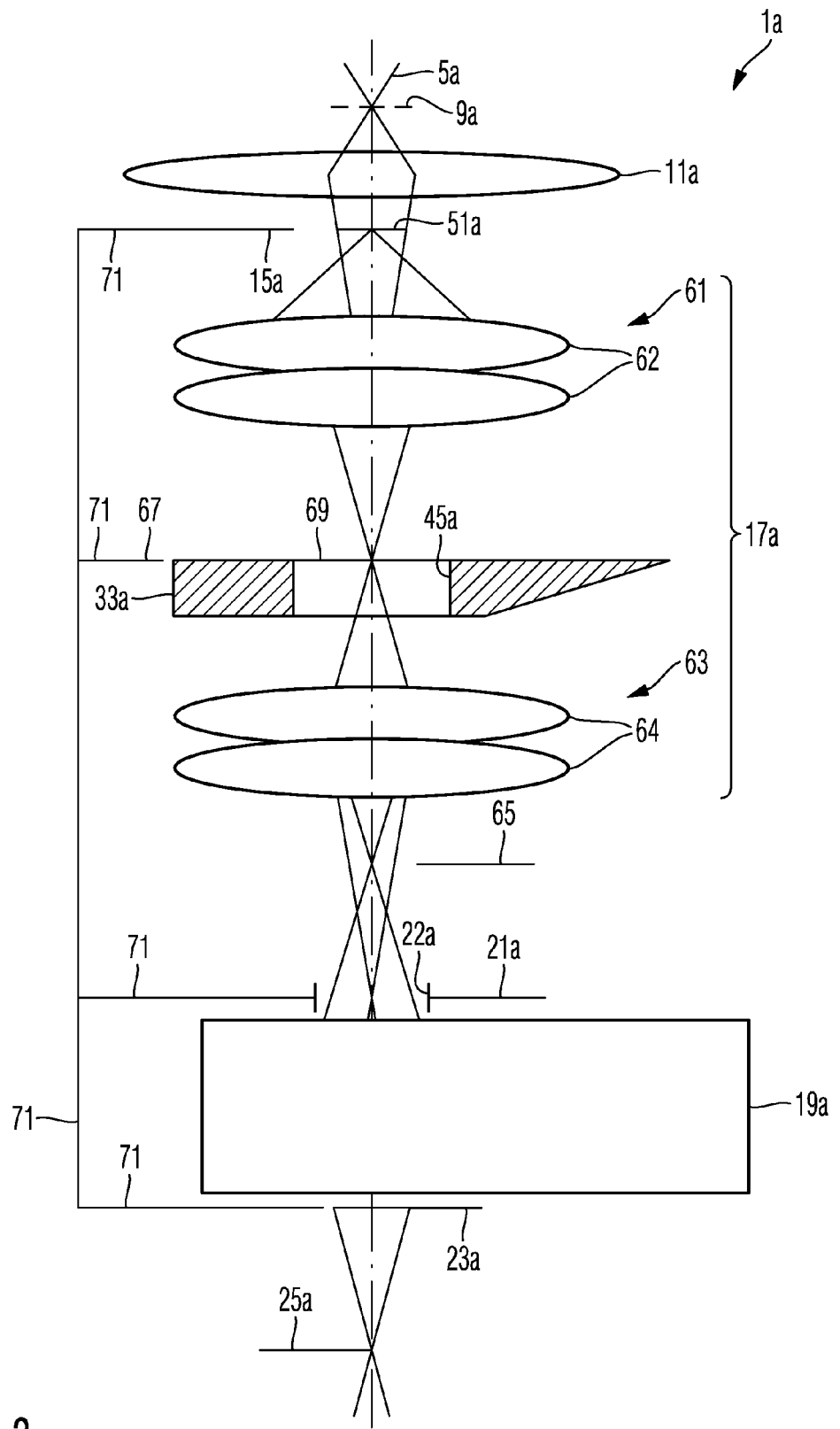
FIG. 3 is a schematic illustration of a transmission electron microscope including an energy filter and a dark field detector.

FIG. 3 is a schematic illustration of a transmission electron microscope 1a meeting these conflicting interests. The transmission electron microscope 1a comprises a beam source and further beam forming components, not shown in FIG. 3, configured to direct an electron beam 5a having a half opening angle $\alpha_0$ onto a sample plane 9a. An objective lens 11a, a projection lens system 17a and an energy filter 19a are positioned downstream of the sample plane 9a. The projection lens system 17a has two stages and comprises a first projection lens system 61 having at least two lenses and a second projection lens system 63 having at least two lenses. The energy filter 19a has, on its upstream side, an entrance image plane 21a and an entrance pupil plane 65a and, on its downstream side, an achromatic image plane 23a and a spectrum plane 25a. Further lenses and detectors, not shown in FIG. 3, can be positioned downstream of the spectrum plane 25a.

The projection lens system 17a is configured such that the sample plane 9a is imaged into the entrance pupil plane 65 of the energy filter 19a and that a diffraction plane 15a of the objective lens 17a is imaged into the entrance image plane 21a of the energy filter 19a. Herein, the first projection lens system 61 which has two or more lenses images the diffraction plane 15a into an intermediate diffraction plane 67 which, in turn, is imaged by the second projection lens system 63 which has one or more lenses 64 into the entrance image plane 21a of the energy filter 19a. The imaging of the diffraction plane 15a into the intermediate diffraction plane 67 is a magnifying imaging having a magnification $M_1$ which is, for example, within a range from 8 to 40. With $\alpha_0$ having values from, for example, 10 mrad to 50 mrad and a focal length $f_0$ of the objective lens 11a of, for example, 1.7 mm, a diameter of a bright field diffraction image 51a $\Phi_{Diff}=2f_0\alpha_0$ amount to 34 μm to 170 μm. The bright field image of the diffraction plane 51a is imaged by the first projection lens system 61 into a bright field image 69 in the intermediate diffraction plane 67, wherein the bright field image 69 has a diameter $\Phi_{BF}=M_1\Phi_{Diff}$. This diameter is about 1.4 mm for, for example, $\alpha_0=50$ mrad and $M_1=4$, and the diameter is also about 1.4 mm for $\alpha_0=10$ mrad and $M_1=40$.

In the illustrated example, a dark field detector 33a is positioned in the intermediate diffraction plane 67 in order to detect electrons which have been scattered in the sample plane 9a by a significant scattering angle, while bright field electrons and dark field electrons which have been scattered by a smaller scattering angle may traverse the dark field detector 33a.

The second projection lens system 63 images the intermediate diffraction plane 67 into the entrance image plane 21a of the energy filter 19a at a magnification $M_2$ such that a diameter of the diffraction image 22a in the entrance image plane 21a is, in the illustrated example, less than 300 μm in order to allow for a desired high resolution of the energy filter 19a. For this purpose, the magnification $M_2$ of the imaging provided by the second projection lens system 63 can be within a range of, for example, 0.1 to 1.5, and, in particular, this magnification $M_2$ can be less than 1.

The multi-stage imaging of the diffraction plane 15a into the entrance image plane 21a of the energy filter 19a via the intermediate diffraction plane 67 and the arrangement of the dark field detector 33a in the intermediate diffraction plane 67a may achieve plural advantages: (a) it is possible to detect, at a given diameter of an aperture 45a of the dark field detector 33a, also dark field electrons scattered at a relatively small scattering angle in the sample plane 9a, since the imaging provided by the first projection lens system 61 has a magnification greater than 1; (b) the further imaging of the intermediate diffraction plane 67 into the entrance image plane 21a of the energy filter 19a can be a reducing imaging having a magnification less than 1, if necessary, such that a diameter of the diffraction image 22a which is subject to a subsequent energy filtering, can be limited such that the energy resolution of the energy filter 19a has a desired low value; and (c) additional space is provided between the objective lens 11a and the energy filter 19a in which the dark field detector 33a or additional components, such as a phase changing element or a bi-prism, can be mounted in this space as illustrated in more detail below.

Lines 71 in FIG. 3 indicate that the diffraction plane 15a, the intermediate diffraction plane 67, the entrance image plane 21a of the energy filter 19a and the achromatic image plane 23a of the energy filter 19a are conjugate planes imaged into one another by the projection lens system 17a and the energy filter 19a.

Figure 4:
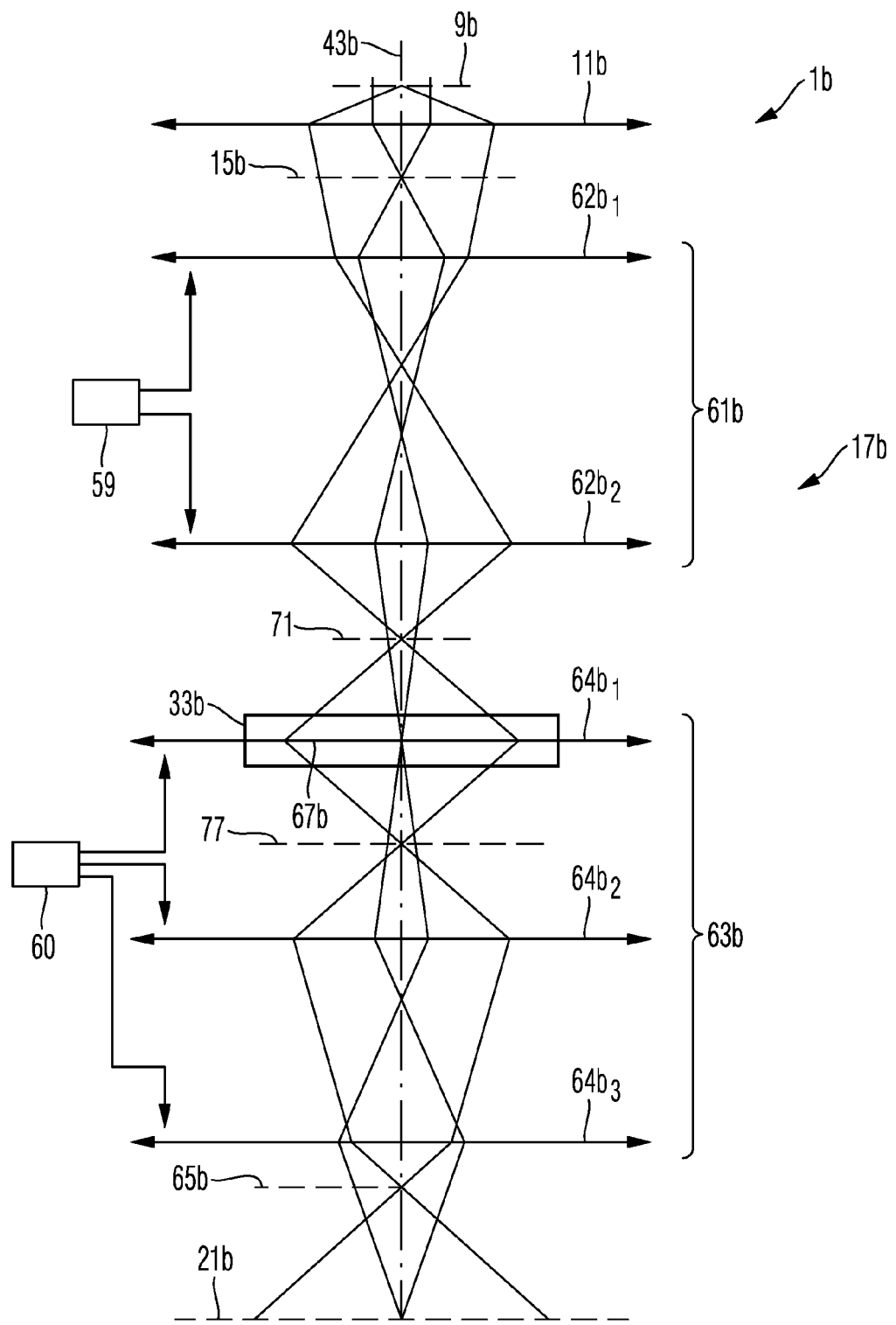
FIG. 4 is a schematic illustration of a beam path of a transmission electron microscope having an energy filter and a dark field detector.

FIG. 4 schematically illustrates a portion of a beam path of a transmission electron microscope 1b. Lenses are illustrated in FIG. 4 as double arrows, and FIG. 4 also shows axial rays and field rays of the beam path.

The transmission electron microscope 1b comprises a beam source, lenses and deflectors (not shown in FIG. 4) configured to focus an electron beam in a sample plane 9b and to scan a location of the beam focus across a region within a sample plane 9b. The transmission electron microscope 1b can be operated as a scanning transmission electron microscope (STEM), accordingly. The transmission electron microscope 1b further comprises an energy filter (not shown in FIG. 4), having an entrance image plane 21b and an entrance pupil plane 65b. Lenses of a projection lens system 17b are arranged between the sample plane 9b and the entrance pupil plane 65b of the energy filter, wherein the projection lens system 17b comprises a first projection lens system 61b having two lenses $62b_1$ and $62b_2$, and a second projection lens system 63b having three lenses $64b_1$, $64b_2$ and $64b_3$. The first projection lens system 61b images, together with the objective lens 11b, the sample plane 9b into an intermediate image plane 71, wherein a position of the intermediate image plane 71 along an optical axis 43b can be varied. The first projection lens system 61b further images a diffraction plane 15b of the objective lens 11b into an intermediate diffraction plane 67b.

In the example illustrated in FIG. 4, a dark field detector 33b is located in the intermediate diffraction plane 67b. The dark field detector 33b is configured to detect electrons scattered in the sample plane 9b by an angle greater than a threshold scattering angle and to allow electrons to pass through the detector which have not been scattered in the sample plane or which have been scattered in the sample plane 9b by an angle smaller than the threshold scattering angle. This threshold scattering angle can be adjusted by adjusting a magnification of the imaging of the diffraction plane 15b into the intermediate diffraction plane 67. The adjustment and changing of the magnification of this imaging is achieved by adjusting and changing an energization of the lenses $62b_1$ and $62b_2$. This change of energization of lenses $62b_1$ and $62b_2$ is performed such that a position of the intermediate diffraction plane 67b along an optical axis 43b of the transmission electron microscope 1b remains unchanged and independent of the selected magnification. It is, however, not possible to also maintain a position of the intermediate image 71 along the optical axis 43b unchanged when the position of the intermediate diffraction plane 67b remains unchanged when the magnification is changed. The position of the intermediate image 71 along the optical axis 43b will change when the magnification of the imaging of the diffraction plane 15b into the intermediate diffraction plane 67b is changed.

FIG. 4 schematically shows a first control module 59 configured energize the lenses $62b_1$ and $62b_2$ of the first projection lens system 61b, and a second control module 60 configured energize the lenses $64b_1$, $64b_2$ and $64b_3$ of the second projection lens system 63b as illustrated above by adjusting currents supplied to coils of the respective lenses.

The second projection lens system 63b images the intermediate diffraction plane 67b into the entrance image plane 21b of the energy filter, and it also images the intermediate image plane 71b into the entrance pupil plane 65b of the energy filter. Herein, a magnification of the imaging of the intermediate diffraction plane 67b into the entrance image plane 21b can be adjusted such that a diameter of the image in the entrance image plane 21b of the energy filter does not exceed a desired value selected such that an energy resolution of the energy filter does also not exceed a desired value. Therefore, the magnification of the imaging of the intermediate diffraction plane 67b into the entrance image plane 21b of the energy filter by lenses $64b_2$ and $64b_3$ should be changed if the magnification of the imaging of the diffraction plane 15b into the intermediate diffraction plane 67b by the first projection lens system 61b is changed. Since changing of the magnification provided by the first projection lens system 61b also changes the position of the intermediate image 71 along the optical axis 43b, a focal length of the lens $64b_1$ positioned in the intermediate diffraction plane 67b should be changed together with the change in magnification provided by the lenses $64b_2$ and 64b3 in order allow for a correct imaging of the intermediate image plane 71 into the entrance pupil plane 65b of the energy filter.

For this purpose, the lens $64b_1$ can be positioned such that its main plane coincides with the intermediate diffraction plane 67b or such that its main plane is located proximate to the intermediate diffraction plane 67b. This has an advantage in that a change of the focal length of lens $64b_1$ does substantially not affect the imaging of the diffraction plane. An energization of the lens $64b_1$ can be used to adjust the imaging of the intermediate image plane without substantially affecting the imaging of the diffraction plane.

Figure 5:
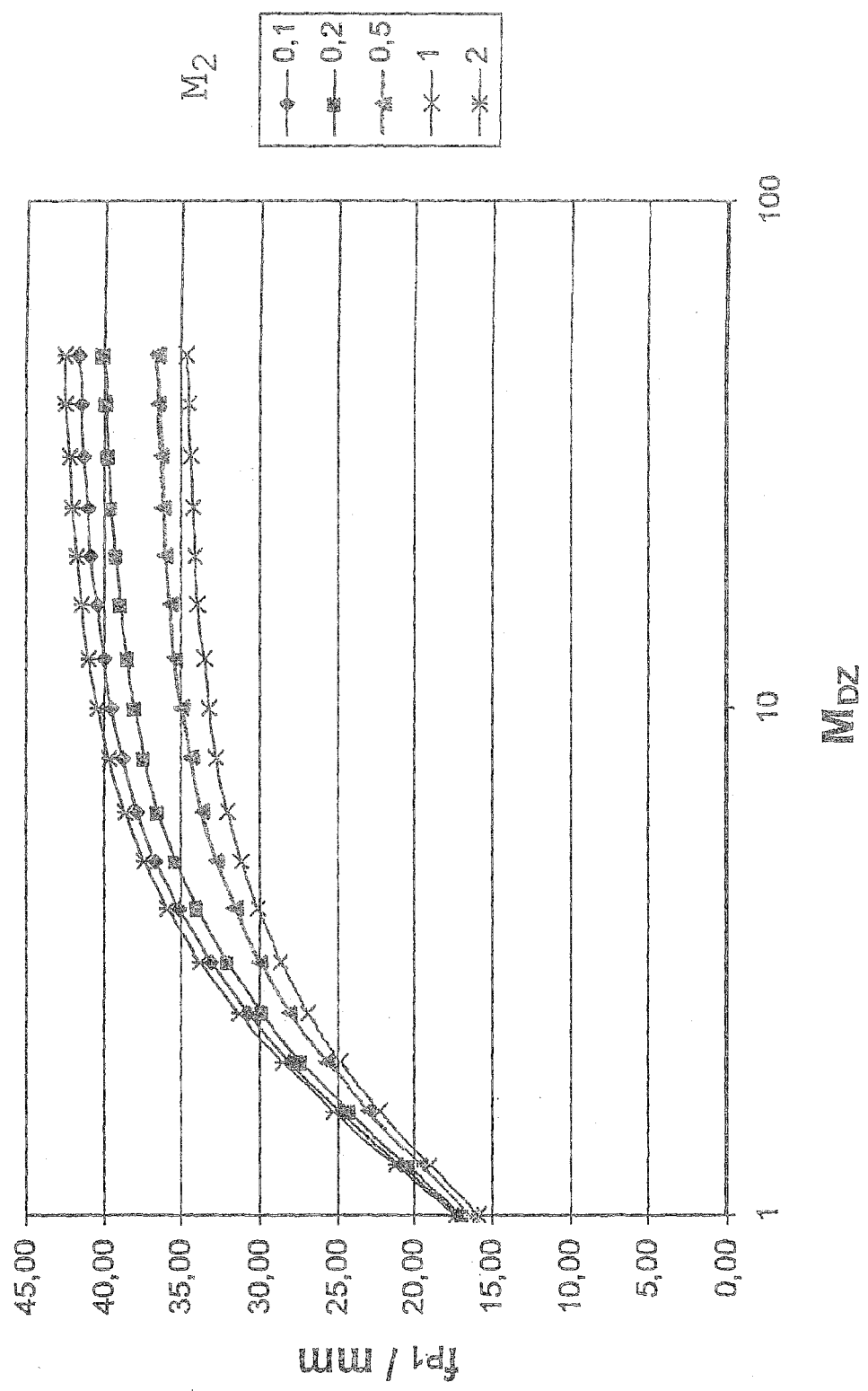
FIG. 5 is a graph illustrating relations between properties of the transmission electron microscope shown in FIG. 4.

FIG. 5 is a graph showing plural lines representing a dependency between the focal length $f_{P1}$ of the lens $64b_1$ and the magnification $M_{DZ}$ of the imaging of the diffraction plane 15b into the intermediate diffraction plane 67b, wherein each line shows the dependency for a fixed value $M_2$ of the magnification of the imaging of the intermediate diffraction plane 67b into the entrance image plane 21b of the energy filter.

Figure 6:
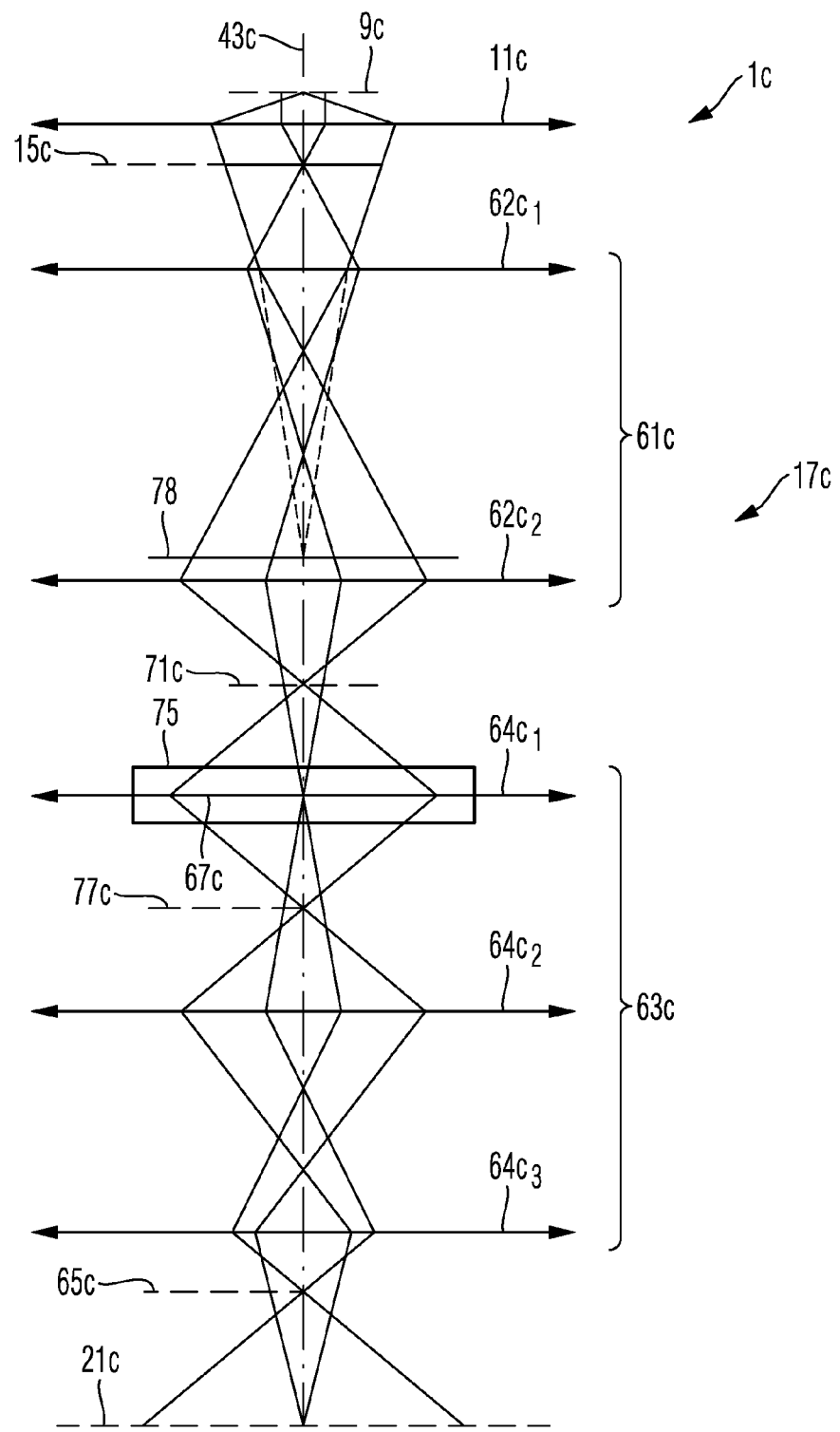
FIG. 6 is a schematic illustration of a beam path of a transmission electron microscope having an energy filter and a phase changing element.

FIG. 6 schematically illustrates a portion of a beam path of a further example of a transmission electron microscope 1c. The beam path of the transmission electron microscope 1c is similar to the beam path of the scanning transmission electron microscope (STEM) illustrated with reference to FIGS. 4 and 5 above in that a projection lens system 14c and an energy filter having an entrance pupil plane 65c and an entrance image plane 21c are positioned downstream of an objective lens 11c in the beam path of the microscope. Moreover, the projection lens system 17c comprises a first projection lens system 61c for imaging a sample plane 9c into an intermediate image plane 71c and for imaging a diffraction plane 15c of the objective lens 11c into an intermediate diffraction plane 67b. Different from the example illustrated with reference to FIG. 4, an extended field of the sample plane 9c is illuminated with an electron beam in the example shown in FIG. 6. The extended illuminated field may typically have a diameter from about 1 μm to 100 μm. The illuminating electron beam can be a parallel beam in which an aperture angle of the electrons incident on the sample plane can be 10 to 100 times smaller than in the STEM illustrated with reference to FIG. 4. Therefore, exemplary values of aperture angles or cone angles of the electron beam illuminating the sample in transmission electron microscopes of the types illustrated with reference to FIG. 6 may amount to 0.1 mrad to 1 mrad. The example shown in FIG. 6 further differs from the example shown in FIG. 4 in that it is not the intermediate diffraction plane 67c which is imaged into the entrance image plane 21c of the energy filter. Specifically, the intermediate diffraction plane of the example shown in FIG. 6 is imaged into the entrance pupil plane of the energy filter while, in the present example, the intermediate image plane 71c is imaged into the entrance image plane 21c of the energy filter.

A phase changing element 75 is positioned in the intermediate diffraction plane 67c. The phase changing element 75 is configured such that a phase shift is generated between a group of electrons scattered at the sample and traveling on trajectories traversing the intermediate diffraction plane 67b at a greater distance from the optical axis 43b, and a group of electrons traversing the sample substantially unscattered and traveling on trajectories intersecting the intermediate diffraction plane 67c at smaller distances from the optical axis. The two groups of electrons experiencing the different phase shifts are superimposed with each other in an intermediate image plane 77c located downstream of the intermediate diffraction plane 67c, and they interfere with each other in the intermediate image plane 77c to generate a phase contrast image of the sample plane 9c. The intermediate image plane 77c can be positioned along the main axis 43c by suitably adjusting an energization of the lens $64c_1$ such that the phase contrast image is imaged by lenses $64c_2$ and $64c_3$ into the entrance image plane 21c of the energy filter while the intermediate diffraction plane 67c is simultaneously imaged into the entrance pupil plane 65c of the energy filter. An energy filtered phase contrast image of the sample plane 9c can be generated in an achromatic image plane downstream of the energy filter, accordingly.

There are plural types of suitable phase changing elements. One example of a phase changing element is illustrated in U.S. Pat. No. 7,741,602 B2, the full disclosure of which is incorporated herein by reference. According to this example, electrons traversing the phase changing element at a distance from the optical axis which is smaller than a threshold radius traverse an electrostatic potential which is different from an electrostatic potential traversed by electrons traversing the phase changing element at a distance from the optical axis which is greater than the threshold radius. A further type of phase changing element is known from US 2008/0035854 A1, the full disclosure of which is incorporated herein by reference. According to this example, the phase changing element comprises a thin circular ring traversed by the electrons, such that electrons traversing the ring section experience a phase shift relative to electrons traversing the inner circular aperture of the ring.

The phase changing element provides different phase shifts to two groups of electrons, wherein one group traverses the phase changing element at distances smaller than the threshold radius and the other group traverses a phase changing element at distances from the optical axis greater than the threshold radius. This threshold radius defines a corresponding threshold scattering angle for electrons scattered in the sample, wherein the electrons scattered by an angle smaller than the threshold angle form the first group of electrons and electrons scattered by an angle greater than the threshold angle form the second group of electrons. It can be desirable to adjust the threshold scattering angle. This could be achieved by changing the first radius of the phase changing element, i.e. by changing the geometry of the phase changing element. However, changing the geometry of the phase changing element is not easily possible.

In the illustrated example, an adjustment of the threshold scattering angle is achieved by changing the magnification of the imaging of the diffraction plane $15c$ into the intermediate diffraction plane $67c$ in which the phase changing element $75$ is positioned. The first projection lens system $61c$ of the example illustrated with reference to FIG. 6 is configured such that energization of the lenses $62c_1$ and $62c_2$ can be changed in order to change the magnification of the imaging of the diffraction plane $15c$ into the intermediate diffraction plane $67c$ while maintaining a position of the intermediate diffraction plane $67c$ along the optical axis $73c$. However, if the magnification of the imaging of the diffraction plane $15c$ into the intermediate diffraction plane $67c$ is changed, a position of the intermediate image plane $71c$ into which the object plane $9c$ is imaged by the first projection lens system $61c$ will also change. Such displacement of the position of the intermediate image plane $71c$ can be compensated by changing a focal length of lens $64c_1$. The focal length of the lens $64c_1$ can be adjusted such that the intermediate image is generated by the lens $64c_1$ in the plane $77c$ which is imaged by the lenses $64c_2$ and $64c_3$ into the entrance image plane $21c$ of the energy filter. In the illustrated example, the imaging of the object plane $9c$ into the intermediate image plane $71c$ by the first projection system can be a reducing imaging having a magnification smaller than 1, while the imaging of the intermediate image in the plane $77c$ into the entrance image plane $21c$ of the energy filter can be a magnifying imaging having a magnification greater than 1.

Also the transmission electron microscope $1c$ comprises a first control module (not shown in FIG. 6) configured energize the lenses $62c_1$ and $62c_2$ of the first projection lens system $61c$, and a second control module (not shown in FIG. 6) configured energize the lenses $64c_1$, $64c_2$ and $64c_3$ of the second projection lens system $63c$ as illustrated above by adjusting currents supplied to coils of the respective lenses.

Figure 7:
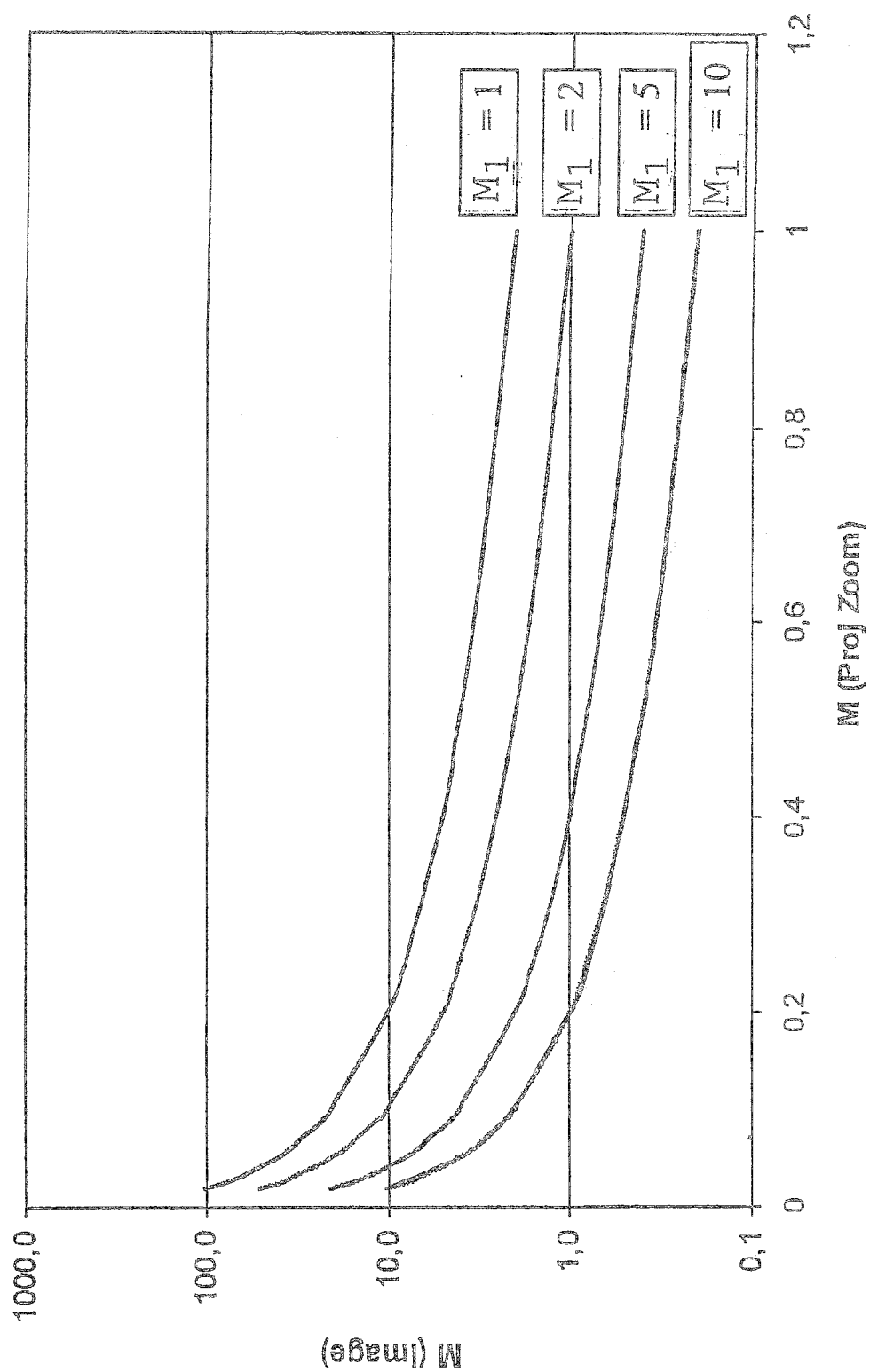
FIG. 7 is a graph illustrating relations between properties of the transmission electron microscope shown in FIG. 6.

FIG. 7 shows a graph having plural lines showing a dependency of a magnification M (Image) of an imaging provided by the projection lens system $17c$, i.e. the imaging of a virtual intermediate image plane $78$ of the objective lens $11c$ into the entrance image plane $21c$ of the energy filter, and a magnification M (Proj Zoom) of an imaging of the intermediate diffraction plane $67c$ into the entrance pupil plane $65c$ of the energy filter.

Figure 8:
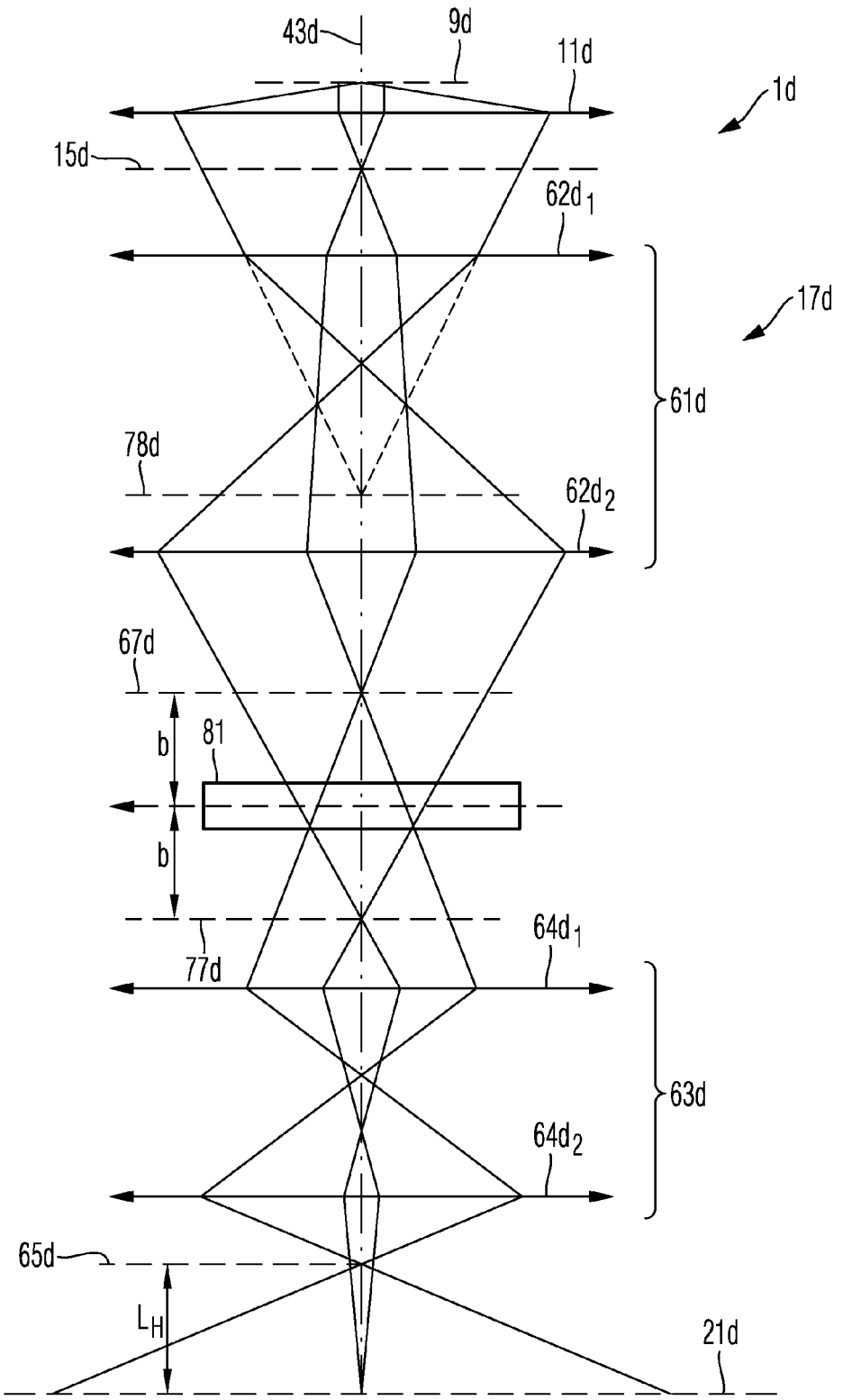
FIG. 8 is a schematic illustration of a beam path of a transmission electron microscope including an energy filter and a bi-prism.

FIG. 8 schematically shows a portion of a beam path of a further exemplary transmission electron microscope $1d$. The transmission electron microscope $1d$ shown in FIG. 8 is similar to the microscope illustrated above with reference to FIGS. 6 and 7 in that a sample plane $9d$ is imaged into an entrance image plane $21d$ of an energy filter and a diffraction plane $15d$ of an objective lens $11d$ is imaged into an entrance pupil plane $65d$ of the energy filter by the objective lens $11d$ and a projection lens system $17d$.

The transmission electron microscope $1d$ is configured to provide electron holography as an option for sample analysis. For this purpose, the sample in the sample plane $9d$ is illuminated by a coherent electron beam, wherein this sample is positioned such that only a portion of the illuminating beam providing an object wave traverses the sample while another portion of the beam bypasses the sample in vacuum and provides a reference wave relative to the portion of the beam traversing the sample.

A first projection lens system $61d$ of the projection lens system $17d$ comprises two lenses $62d_1$ and $62d_2$ and images a diffraction plane $15d$ of the objective lens $11d$ into an intermediate diffraction plane $67d$, and it also images the object plane $9d$ into an intermediate image plane $77d$. A bi-prism $81$ is positioned in the beam path downstream of the intermediate diffraction plane $67d$ and upstream of the intermediate image plane $77d$. The bi-prism $81$ generates two virtual coherent source images in the intermediate diffraction plane $67d$ such that an interference pattern is generated in a region of the intermediate image plane $77d$ by an interference between the object wave and the reference wave. This interference pattern contains phase information relative to the sample and can be analyzed to obtain information relating to properties of the sample.

There are plural options of providing a bi-prism. One option is the bi-prism of the Moellenstedt type in which a thin charged fiber is positioned between two plates at ground potential. If a positive electric potential is applied to the fiber, trajectories of electrons bypassing the fiber are deflected towards the optical axis $43d$ and generate two virtual coherent source images in the intermediate diffraction plane $67d$.

It is advantageous if the lenses $62d_1$ and $62d_2$ of the first projection lens system $61d$ are energized such that the diffraction plane (Fourier plane) $67d$ and the image plane $77d$ are positioned along the optical axis $43d$ such that the bi-prism $81$ is symmetrically positioned between the diffraction plane $67d$ and the image plane $77d$. This means that a distance b between the bi-prism $81$ and the diffraction plane $67d$ is equal to a distance b between the bi-prism $81$ and the image plane $77d$.

A second projection lens system $63d$ of the projection lens system $17d$ comprises two lenses $64d_1$ and $64d_2$ and images the intermediate diffraction plane $67d$ into the entrance pupil plane $65d$ of the energy filter, and it also images the intermediate image plane $77d$ into the entrance image plane $21d$ of the energy filter, such that an energy filtered or inelastic interference image and an energy loss spectrum can be recorded downstream of the energy filter.

The distance b can be changed by changing an energization of the lenses $62d_1$ and $62d_2$. A change of the distance b results in a change of a magnification MBI of the imaging of the sample plane $9d$ into the intermediate image plane $77d$ of the projection lens system $61d$. There exist two different magnifications MBI (high) and MBI (low) fulfilling the condition that the bi-prism $81$ has the distance b from both the intermediate diffraction plane 67d and the intermediate image plane 77d. Similarly, there exist two different magnifications, MFEI (high) and MFEI (low) and corresponding energizations of the lenses 64$d_1$ and 64$d_2$ for the second projection lens system 63d providing the imaging of the intermediate diffraction plane 67d into the entrance pupil plane 65d of the energy filter and of the intermediate image plane 77d into the entrance image plane 21d of the energy filter.

Also the transmission electron microscope 1d comprises a first control module (not shown in FIG. 8) configured energize the lenses 62$d_1$ and 62$d_2$ of the first projection lens system 61d, and a second control module (not shown in FIG. 8) configured energize the lenses 64$d_1$, 64$d_2$ and 64$d_3$ of the second projection lens system 63d as illustrated above by adjusting currents supplied to coils of the respective lenses.

Figure 9:
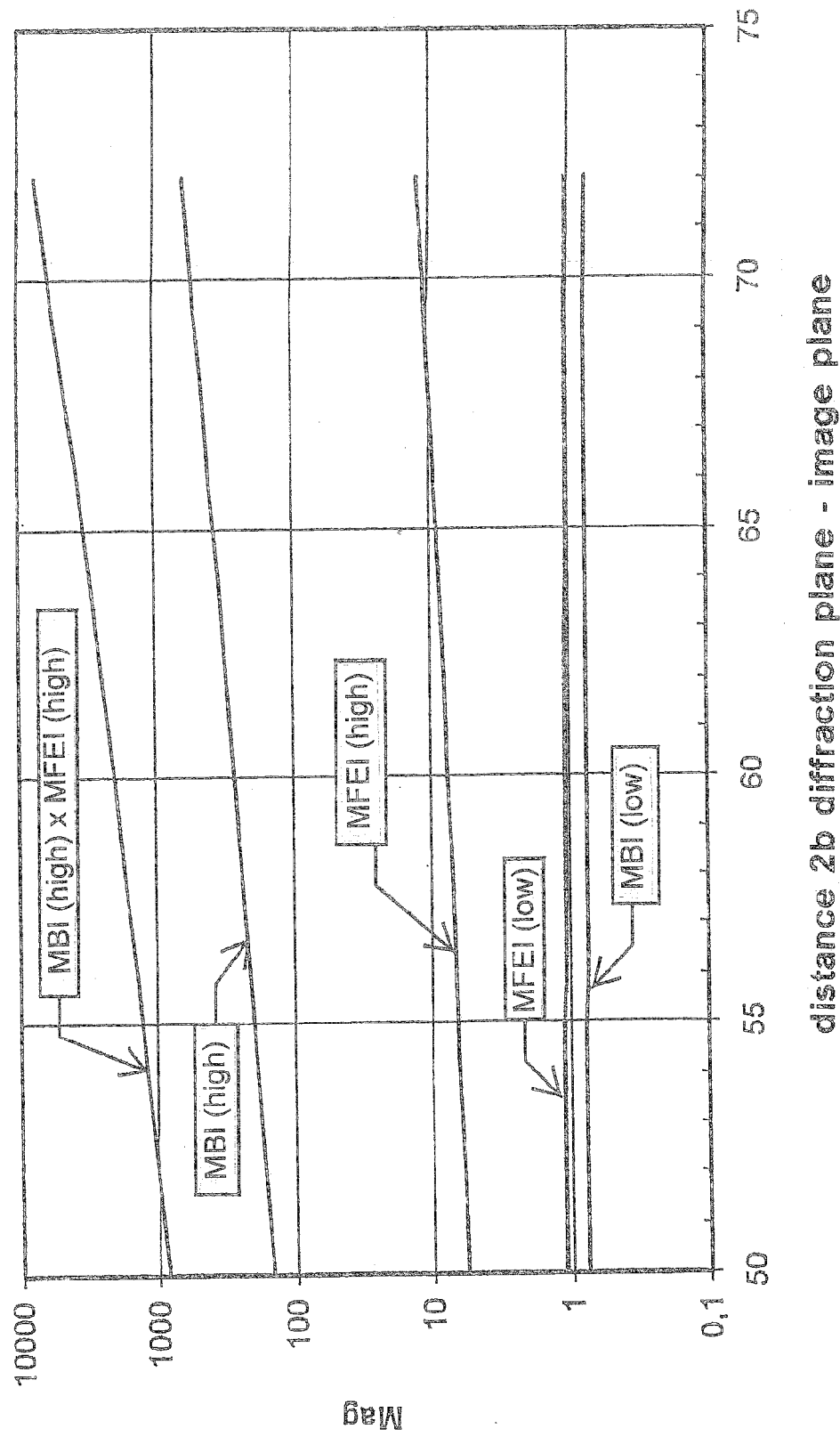
FIG. 9 is a graph illustrating relations between certain properties of the transmission electron microscope shown in FIG. 8.

FIG. 9 shows dependencies between magnifications within the projection lens system 17d and the distance b. Specifically, FIG. 9 shows graphs representing dependencies of the distance 2b between the intermediate diffraction plane 67d and the intermediate image plane 77d of the higher magnification MBI (high) and the lower magnification MBI (low) of the imaging of the sample plane 9d into the image plane 77d, the higher magnification MFEI (high) and the lower magnification MFEI (low) of the imaging of the image plane 77d into the entrance image plane 21d of the energy filter and of the product MBI (high)×MFEI (high).

Figure 10:
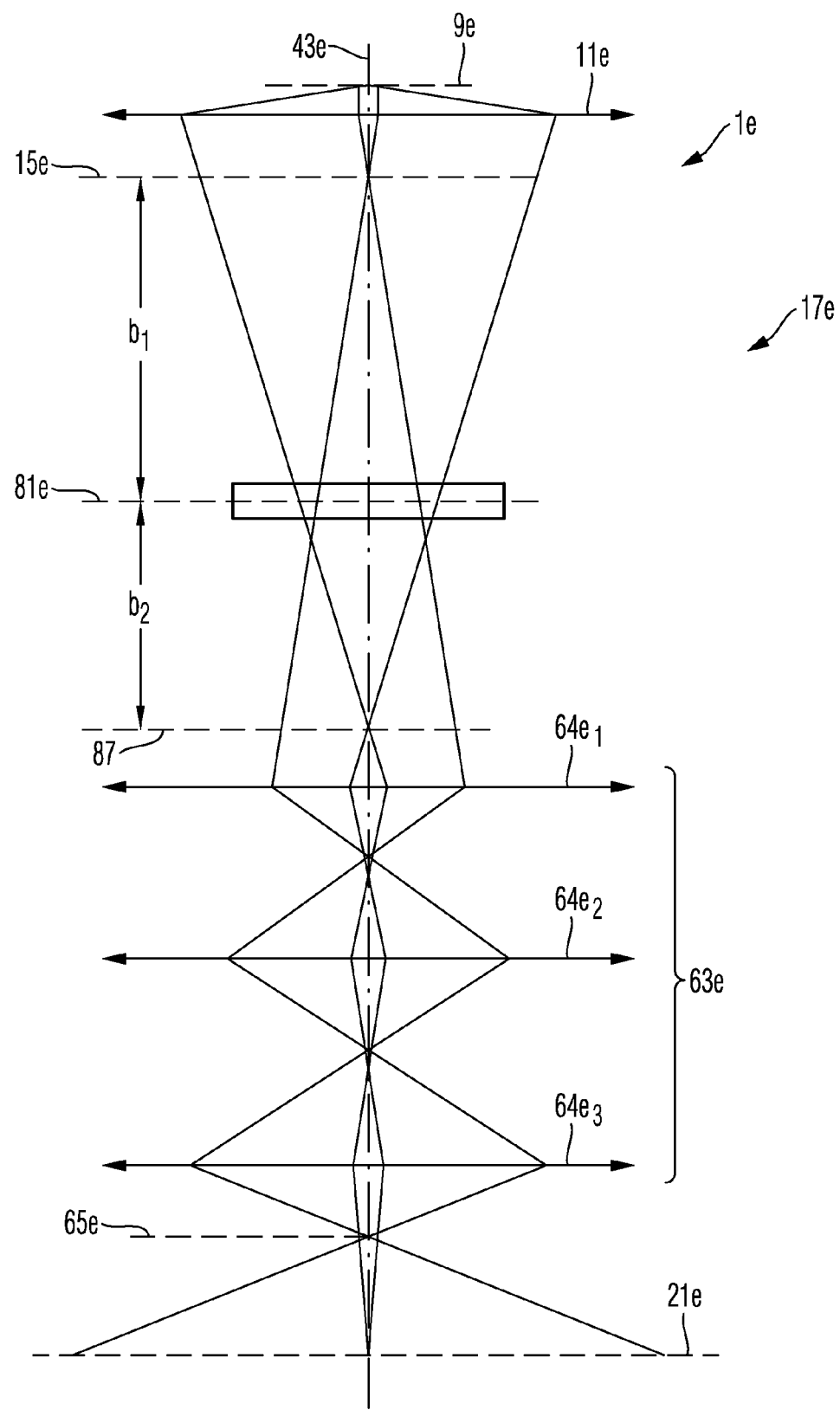
FIG. 10 is a schematic illustration of a beam path of a transmission electron microscope including an energy filter and a bi-prism.

FIG. 10 is a schematic illustration of a beam path of a further exemplary transmission electron microscope. The transmission electron microscope 1e shown in FIG. 10 has a configuration similar to the transmission electron microscope illustrated with reference to FIGS. 8 and 9 above in that a bi-prism 81e is disposed in a beam path downstream of an objective lens 11e between a diffraction plane 15e of the objective lens 11e and an image plane 87e of the objective lens 11e. The microscope 1e further comprises an energy filter or some other analyzing system having an entrance pupil plane 65e and an entrance image plane 21e. A projection lens system 17e of the microscope 1e comprises a second projection lens system 63e having three lenses 64$e_1$, 64$e_2$ and 64$e_3$ positioned downstream of an image plane 87 of the objective lens 11d. The second projection lens system 63e images the image plane 87 of the objective lens 11e into the entrance image plane 21e of the energy filter, and it also images the diffraction plane 15e of the objective lens 11e into the entrance pupil plane 65e of the energy filter.

The beam path shown in FIG. 10 can be provided by any of the microscopes illustrated with reference to FIGS. 2 to 9 above if the lenses 62 of the first projection lens system 61 are not energized in those microscopes.

Figure 11:
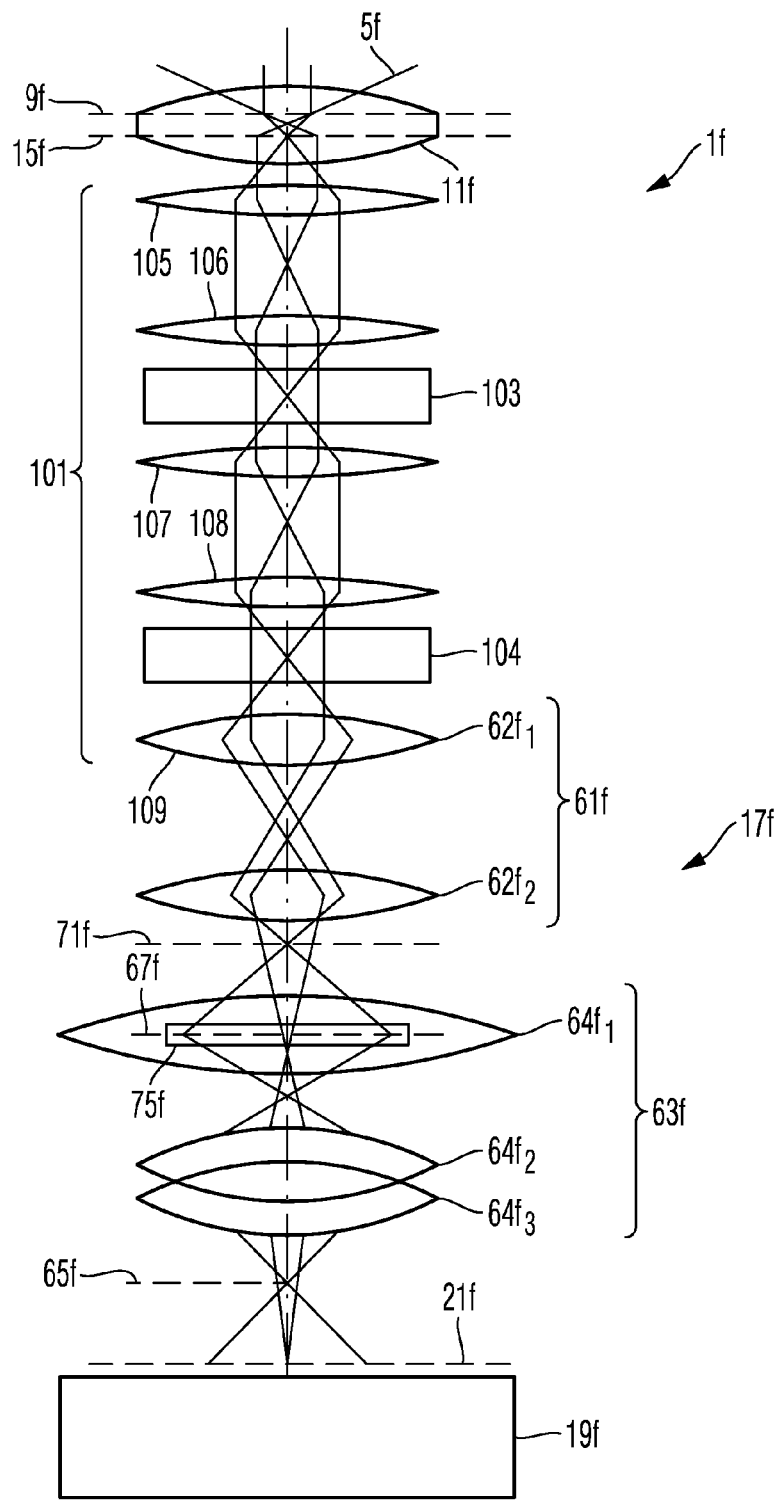
FIG. 11 is a schematic illustration of a transmission electron microscope including an energy filter and an image corrector.

FIG. 11 schematically illustrates a beam path of an exemplary corrected transmission electron microscope. The transmission electron microscope 1f shown in FIG. 11 has a configuration similar to the microscope illustrated with reference to FIGS. 6 and 7 above in that a phase changing element 75f and an energy filter 19f are positioned downstream of an objective lens 11f in the beam path. The phase changing element 75f is positioned in an intermediate diffraction plane 67f into which a back focal plane 15f of the objective lens 11f is imaged via a multi-stage imaging. The intermediate diffraction plane 67f in which the phase changing element is positioned is imaged into an entrance pupil plane 65f of the energy filter 19f, while a sample plane 9f is imaged into an entrance image plane 21f of the energy filter 19f via a multi-stage imaging.

For this purpose, the transmission electron microscope 1f comprises a projection lens system 17f including a first projection lens system 61f having two lenses 62$f_1$ and 62$f_2$ positioned upstream of a phase changing element 75f and configured to adjust a magnification of the imaging of the diffraction plane 15f into the intermediate diffraction plane 67f. A second projection lens system 63f of the projection lens system 17f has three lenses 64$f_1$, 64$f_2$ and 64$f_3$ and is configured to image the intermediate diffraction plane 67f into the entrance pupil plane 65f of the energy filter 19f and to image an intermediate image of the sample plane 9f generated upstream of the phase changing element 75f in a plane 71f into the entrance image plane 21f of the energy filter 19f.

The transmission electron microscope 1f shown in FIG. 11 differs from the microscope illustrated with reference to FIGS. 6 and 7 above in that the microscope 1f comprises a corrector 101 provided in the beam path between the objective lens 11f and the projection lens system 17f. The corrector is configured to reduce or compensate imaging errors, such as an opening error or spherical aberration, generated by the objective lens 11f. For this purpose, the corrector 101 comprises two hexapole elements 103 and 104, lenses 105 and 106 positioned between the objective lens 11e and the hexapole element 103, lenses 107 and 108 positioned between hexapole element 103 and hexapole element 104, and a lens 109 positioned downstream of the hexapole element 104. In the example shown in FIG. 11, the lens 62$f_1$ of the first projection lens system 61f and the last lens 109 of the corrector 101 are provided by a same common lens. However, it is also possible to provide separate lenses for the first lens 62$f_1$ of the first projection lens system 61f and the last lens 109 of the corrector 101.

The exemplary transmission electron microscope 1f shown in FIG. 11 comprises an energy filter 19f and a phase changing element 67f in order to perform an analysis of the phase contrast type, wherein a corrector 101 is provided for reducing imaging errors. Similarly, it is possible to modify the beam path of the transmission electron microscopes illustrated with reference to FIGS. 1 to 10 above by inserting a corrector into the beam path downstream of the objective lens. Specifically, a corrector can be used in the transmission electron microscope having an energy filter and a dark field detector as illustrated with reference to FIGS. 3, 4 and 5 above. Similarly, a corrector can be used in a transmission electron microscope having an energy filter and a bi-prism as illustrated with reference to FIGS. 8, 9 and 10 above in order to perform an analysis of the holography type.

FIG. 11 shows an example of a transmission electron microscope having a corrector for reducing and correcting imaging errors. All the examples illustrated above may include a corrector positioned downstream of the objective lens for reducing imaging errors, or they may not comprise such corrector.

The examples of transmission electron microscopes illustrated above comprise a projection lens system downstream of the objective lens, wherein the projection lens system includes first and second projection lens systems, wherein an intermediate image of a diffraction plane of the objective lens is generated downstream of the first projection lens system and upstream of the second projection lens system. The first and second projection lens systems are configured such that a position of the intermediate image of the diffraction plane along the beam path is not changed when a magnification of an imaging provided by the first projection lens system is changed.

Plural electron optical elements can be positioned in or proximate to the plane in which the intermediate image of the diffraction plane is generated. Examples of such elements are a detector and a phase changing element.

An analyzing system is provided downstream of the second projection lens system. There exist at least three options: (a) an energy filter can be provided downstream of the second projection lens system, wherein a final projection lens system is provided downstream of the energy filter and upstream of a detector; (b) further, a final projection lens system can be provided downstream of the second projection lens system and wherein a detector is provided downstream of the final projection lens system, wherein an energy filter is not provided between the second projection lens system and the final projection lens system; and (c) a so called post-column energy filter can be positioned downstream of the second projection lens system, wherein optics including one or more quadrupole elements are provided downstream of the post-column energy filter and upstream of a detector.

The one or more detectors of all examples illustrated above can be positioned sensitive detectors, or they can be detectors which are not position sensitive.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

What is claimed is:

1. Transmission electron microscope in which a sample can be positioned in a sample plane, wherein the microscope comprises:
    an objective lens positioned downstream of the sample plane in the beam path of the microscope;
    a first projection lens system having plural lenses positioned downstream of the objective lens in the beam path;
    a second projection lens system having plural lenses positioned downstream of the first projection lens system in the beam path; and
    an analyzing system including at least one lens positioned downstream of the second projection lens system in the beam path;
    wherein the objective lens, the first and second projection lens systems and the analyzing system are configured such that the sample plane is imaged into an intermediate image plane by the objective lens and the first projection lens system,
    such that a diffraction plane of the objective lens is imaged into an intermediate diffraction plane by the first projection lens system, and
    such that either
    a) the intermediate image plane is imaged into an entrance image plane of the analyzing system and the intermediate diffraction plane is imaged into an entrance pupil plane of the analyzing system by the second projection lens system, or
    b) the intermediate image plane is imaged into the entrance pupil plane of the analyzing system and the intermediate diffraction plane is imaged into the entrance image plane of the analyzing system by the second projection lens system.

2. The transmission electron microscope according to claim 1, wherein the analyzing system comprises an energy filter.

3. The transmission electron microscope according to claim 1, further comprising a first control module configured to energize at least two lenses of the first projection system such that a magnification of the imaging of the diffraction plane of the objective lens system into the intermediate diffraction plane can be changed.

4. The transmission electron microscope according to claim 3, wherein the first control module is configured to energize the at least two lenses of the first projection lens system such that a position of the intermediate diffraction plane along the beam path remains substantially unchanged when the magnification of the imaging of the diffraction plane of the objective lens system into the intermediate diffraction plane is changed.

5. The transmission electron microscope according to claim 1, wherein a magnification of the imaging of the diffraction plane of the objective lens system into the intermediate diffraction plane is greater than 1.

6. The transmission electron microscope according to claim 5, wherein the magnification of the imaging of the diffraction plane of the objective lens system into the intermediate diffraction plane is within a range from 4 to 80 or within a range from 8 to 40.

7. The transmission electron microscope according to claim 1, further comprising a second control module configured to energize at least two lenses of the second projection lens system, wherein the second control module is configured to switch between two operation modes of the microscope, wherein, in a first operation mode of the microscope, the intermediate image plane is imaged into the entrance image plane of the analyzing system and the intermediate diffraction plane is imaged into the entrance pupil plane of the analyzing system, and wherein, in a second operation mode of the microscope, the intermediate image plane is imaged into the entrance pupil plane of the analyzing system and the intermediate diffraction plane is imaged into the entrance image plane of the analyzing system.

8. The transmission electron microscope according to claim 1, wherein a magnification of the imaging of the intermediate diffraction plane into the entrance pupil plane of the energy filter is less than 3.

9. The transmission electron microscope according to claim 8, wherein the magnification of the imaging of the intermediate diffraction plane into the entrance pupil plane of the energy filter is within a range from 0.05 to 3 or within a range from 0.1 to 1.5.

10. The transmission electron microscope according to claim 1, wherein the second projection lens system includes a lens positioned in the intermediate diffraction plane.

11. The transmission electron microscope according to claim 1, further comprising a dark field detector positioned in the intermediate diffraction plane.

12. The transmission electron microscope according to claim 11, wherein the dark field detector includes a sensitive region spaced apart from a main axis of the beam path, such that electrons traveling on trajectories intersecting the intermediate diffraction plane at a greater distance from the main axis are incident on the sensitive region, while electrons traveling on trajectories intersecting the intermediate diffraction plane at smaller distances from the main axis can bypass the dark field detector.

13. The transmission electron microscope according to claim 1, further comprising a phase changing element positioned in the intermediate diffraction plane.

14. The transmission electron microscope according to claim 13, wherein the phase changing element includes a phase changing region spaced apart from a main axis of the beam path, such that electrons traveling on trajectories traversing the intermediate diffraction plane at a greater distance from the main axis experience a phase shift upon traversal of the phase changing region relative to electrons traveling on trajectories traversing the intermediate diffraction plane at smaller distances from the main axis.

15. The transmission electron microscope according to claim 1, further comprising a bi-prism positioned in the beam path between the diffraction plane of the objective lens system and the energy filter.

16. The transmission electron microscope according to claim 15, wherein the bi-prism and the lenses of the projective lens systems are configured such that:
   c) an intermediate diffraction plane generated by the first projection lens system is located upstream of the bi-prism in the beam path, and/or
   d) an intermediate image plane generated by the first projection lens system is positioned downstream of the bi-prism in the beam path.

17. The transmission electron microscope according to claim 16, wherein a distance between the intermediate diffraction plane of the first projection lens system and the bi-prism is substantially equal to a distance between the bi-prism and the intermediate image plane generated by the first projection lens system.

18. The transmission electron microscope according to claim 1, further comprising an image corrector located in the beam path between the objective lens system and the first projection lens system.

19. The transmission electron microscope according to claim 18, wherein the image corrector includes at least one hexapole element.

* * * * *